United States Patent
Lai et al.

(10) Patent No.: US 10,103,167 B1
(45) Date of Patent: Oct. 16, 2018

(54) MANUFACTURING METHOD OF SEMICONDUCTOR STRUCTURE

(71) Applicant: MACRONIX INTERNATIONAL CO., LTD., Hsinchu (TW)

(72) Inventors: Erh-Kun Lai, Taichung (TW); Hsiang-Lan Lung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/489,765

(22) Filed: Apr. 18, 2017

(51) Int. Cl.
  H01L 27/11582 (2017.01)
  H01L 27/11556 (2017.01)
  H01L 21/02 (2006.01)
  H01L 21/3213 (2006.01)
  H01L 21/3205 (2006.01)

(52) U.S. Cl.
  CPC .. H01L 27/11582 (2013.01); H01L 21/02164 (2013.01); H01L 21/3213 (2013.01); H01L 21/32055 (2013.01); H01L 27/11556 (2013.01)

(58) Field of Classification Search
  None
  See application file for complete search history.

(56) References Cited

U.S. PATENT DOCUMENTS

| | | |
|---|---|---|
| 9,053,796 B2 | 6/2015 | Shim |
| 9,281,217 B1 | 3/2016 | Jung et al. |
| 9,401,371 B1 | 7/2016 | Lee et al. |
| 9,412,752 B1 | 8/2016 | Yeh et al. |
| 9,461,063 B1 | 10/2016 | Lai et al. |
| 2011/0291178 A1* | 12/2011 | Sasaki ............ H01L 27/11578 257/324 |

(Continued)

FOREIGN PATENT DOCUMENTS

CN 106298472 A 1/2017

OTHER PUBLICATIONS

Ishiduki, et al.: "Optimal Device Structure for Pipe-shaped BiCS Flash Memory for Ultra High Density Storage Device with Excellent Performance and Reliability"; 97-4244-5640-6/09/$26.00 © 2009 IEEE; pp. 27.3.1-27.3.4.

(Continued)

*Primary Examiner* — Duy T Nguyen
*Assistant Examiner* — Bo Bin Jang
(74) *Attorney, Agent, or Firm* — McClure, Qualey & Rodack, LLP

(57) ABSTRACT

A manufacturing method of a semiconductor structure is provided. The manufacturing method of the semiconductor structure includes the following steps: forming a bottom oxide layer; forming a first conductive layer on the bottom oxide layer; forming a stack including alternately arranged second conductive layers and insulating layers on the first conductive layer; forming a first opening having a first cross-sectional width and penetrating through the stack and a portion of the first conductive layer; forming a second opening having a second cross-sectional width and penetrating through the first conductive layer below the first opening for exposing the bottom oxide layer, wherein the second cross-sectional width is smaller than the first cross-sectional width; and forming a memory layer on a sidewall of the first opening and filled in the second opening.

9 Claims, 8 Drawing Sheets

(56) References Cited

U.S. PATENT DOCUMENTS

| | | | |
|---|---|---|---|
| 2014/0175532 A1* | 6/2014 | Chen | H01L 29/66833 257/324 |
| 2014/0233320 A1* | 8/2014 | Sakaguchi | G11C 16/26 365/185.21 |
| 2016/0064404 A1 | 3/2016 | Lai | |

OTHER PUBLICATIONS

TIPO Office Action dated Jan. 8, 2018 in Taiwan application (No. 106114567).

* cited by examiner

MANUFACTURING METHOD OF SEMICONDUCTOR STRUCTURE

BACKGROUND

Technical Field

The present disclosure relates in general to a manufacturing method of a semiconductor structure, and particularly to a manufacturing method of a semiconductor structure for memory devices.

Description of the Related Art

Recently, various three dimensional (3D) memory devices, such as single gate vertical-channel (SGVC) 3D NAND memory devices having multi-layer stack structures, have been provided due to the rising demands for superior memory components. Such type of 3D memory devices may possess higher memory densities and improved electrical characteristics, for example, excellent reliabilities in data storage and high operating speeds.

In a U turn type SGVC 3D NAND memory device, an inversion gate is used for control assistance. However, during the manufacturing of the inversion gate, over-etching may occur, and the structure of the memory device may be damaged. As such, it is important to improve the methods for manufacturing the inversion gates in memory devices.

SUMMARY

The present disclosure relates in general to a manufacturing method of a semiconductor structure. In the semiconductor structure of the embodiments, the memory layer is formed on the sidewall of the first opening and filled in the second opening of the first conductive layer, thereby the channel layer is formed above the second opening; as such, a relatively large range of the channel layer can be controlled through the first conductive layer by the gate, the range of the channel layer which is uncontrolled by the gate can be effectively reduced, such that the undesired influence caused by larger resistance and smaller current of the region of the channel layer uncontrolled by the gate can be further minimized.

According to an embodiment of the disclosure, a manufacturing method of a semiconductor structure is provided. The manufacturing method of the semiconductor structure includes the following steps: forming a bottom oxide layer; forming a first conductive layer on the bottom oxide layer; forming a stack on the first conductive layer, the stack comprising alternately arranged second conductive layers and insulating layers; forming a first opening having a first cross-sectional width and penetrating through the stack and a portion of the first conductive layer; forming a second opening having a second cross-sectional width and penetrating through the first conductive layer below the first opening for exposing the bottom oxide layer, wherein the second cross-sectional width is smaller than the first cross-sectional width; and forming a memory layer on a sidewall of the first opening and filled in the second opening.

According to another embodiment of the disclosure, a manufacturing method of a semiconductor structure is provided. The manufacturing method of the semiconductor structure includes the following steps: forming a bottom oxide layer; forming a first conductive layer on the bottom oxide layer; forming a stack on the first conductive layer, the stack comprising alternately arranged second conductive layers and insulating layers; forming a first opening having a first cross-sectional width and penetrating through the stack and a portion of the first conductive layer; forming a second opening having a second cross-sectional width and penetrating through the first conductive layer below the first opening for exposing the bottom oxide layer, wherein the second cross-sectional width is smaller than the first cross-sectional width; performing an oxidation process on the first conductive layer exposed in the second opening for forming an oxide filled in the second opening; and forming a memory layer on a sidewall of the first opening and on the oxide.

The above and other aspects of the disclosure will become better understood with regard to the following detailed description of the non-limiting embodiment(s). The following description is made with reference to the accompanying drawings.

DETAILED DESCRIPTION

Figure 1A:
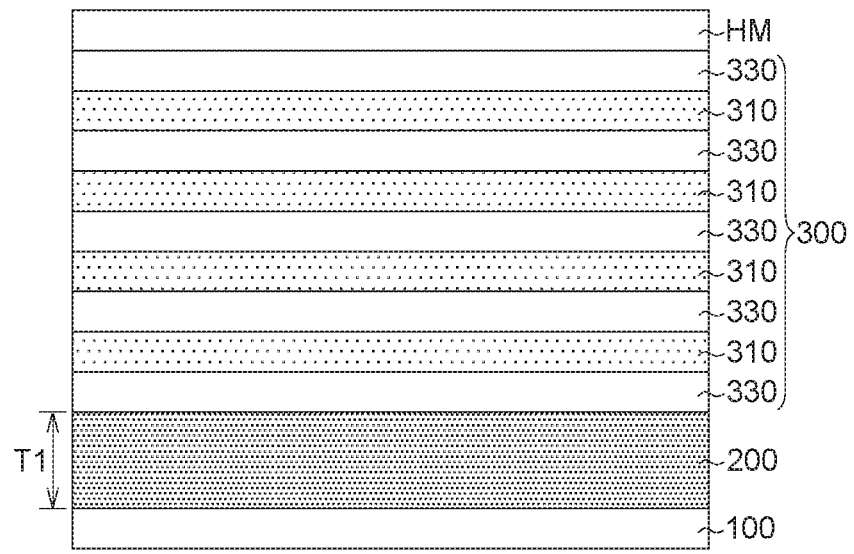
FIGS. 1A-1G illustrate a manufacturing method of a semiconductor structure according to an embodiment of the present disclosure.

In the embodiments of the present disclosure, a manufacturing method of a semiconductor structure is provided. In the semiconductor structure of the embodiments, the memory layer is formed on the sidewall of the first opening and filled in the second opening of the first conductive layer, thereby the channel layer is formed above the second opening; as such, a relatively large range of the channel layer can be controlled through the first conductive layer by the gate, the range of the channel layer which is uncontrolled by the gate can be effectively reduced, such that the undesired influence caused by larger resistance and smaller current of the region of the channel layer uncontrolled by the gate can be further minimized. The following embodiments are for the purpose of elaboration only, not for limiting the scope of protection of the invention. Besides, some of the secondary elements are omitted in the drawings accompanying the following embodiments to highlight the technical features of the invention.

It is to be noted that the following descriptions of preferred embodiments of the present disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regarded as an illustrative sense rather than a restrictive sense. Various modifications and similar arrangements may be provided by persons having ordinary skills in the art within the spirit and scope of the present invention.

In addition, the illustrations may not be necessarily drawn to scale, and the identical elements of the embodiments are designated with the same reference numerals. For purposes of explanation, the following embodiments will be exemplarily focused on a 3D memory device, such as a 3D vertical channel memory device, in particular a U turn type of a SGVC 3D NAND memory device. However, the present disclosure is not limited thereto. For example, the manufacturing method may be applied in other non-volatile memories, general memories, or general semiconductor structures.

FIGS. 1A-1G illustrate a manufacturing method of a semiconductor structure according to an embodiment of the present disclosure.

Please refer to FIG. 1, a bottom oxide layer 100 is formed, a first conductive layer 200 is formed on the bottom oxide layer 100, and a stack 300 is formed on the first conductive layer 200. The stack 300 includes alternately arranged second conductive layers 310 and insulating layers 330, and the second conductive layers 310 are electrically isolated from the first conductive layer 200.

In the embodiments, the bottom oxide layer 100 is such as a buried oxide layer, for example, a silicon oxide layer; the insulating layers 330 may include oxide layers, for example, silicon oxide layers; the first conductive layer 200 may include n-type doped (e.g. phosphorus or arsenic doped) polysilicon, for example, the first conductive layer 200 may be an n-type heavily doped polysilicon layer; the second conductive layers 310 may include p-type doped (e.g. boron doped) polysilicon, for example, the second conductive layers 310 may be p-type heavily doped polysilicon layers.

In the embodiments, the first conductive layer 200 may be used as a gate in a memory device, and the second conductive layers 310 may be used as word lines and ground select lines in a memory device. While gate injections would occur in the operations of word lines, in the embodiments, the second conductive layers 310 made of p-type doped polysilicon can be provided with improved erase effects with an erase voltage up to −4V to −5V.

In the embodiment, as shown in FIG. 1A, the thickness of the second conductive layers 310 is such as about 400 Å, the thickness of the insulating layers 330 is such as about 200 Å, and the thickness T1 of the first conductive layer 200 is such as 500-5000 Å, normally 1500-2000 Å.

Specifically speaking, according to the embodiments of the present disclosure, the first conductive layer 200 has a relatively large thickness T1, such that the etching depth in the subsequent etching processes can be controlled more easily, and it is advantageous to the patterning of the second conductive layers 310 (word lines) in the manufacturing process.

As shown in FIG. 1A, in the embodiment, a hard mask layer HM can be optionally formed on the stack 300. The hard mask layer HM is such as a silicon nitride layer. After the hard mask layer HM is patterned, it can be used in the subsequent photolithography etching process for defining the first opening, the hard mask layer HM can be used for protecting the semiconductor structure from bending or breaking, and moreover, the hard mask layer HM can be used as an oxidation barrier.

Figure 1B:
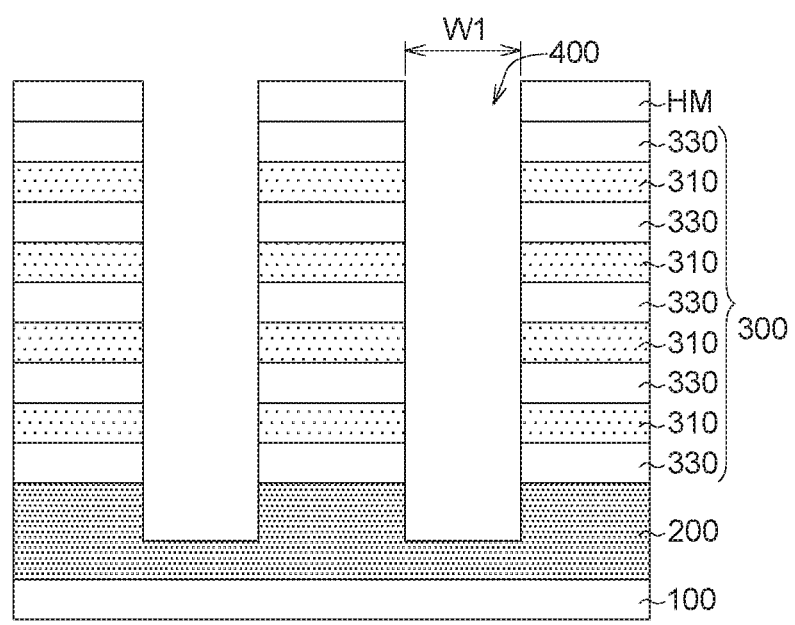

Please refer to FIG. 1B, a first opening 400 is formed. The first opening 400 has a first cross-sectional width W1, and the first opening 400 penetrates through the stack 300 and a portion of the first conductive layer 200. As shown in FIG. 1B, the bottom of the first opening 400 is located in the first conductive layer 200.

In the embodiments, the first cross-sectional width W1 is such as 60 nm-140 nm.

In the embodiment, for example, an etching process is performed on the insulating layers 330, the second conductive layers 310 and a portion of the first conductive layer 200 and stops in the first conductive layer 200 for forming the first opening 400.

Figure 1C:
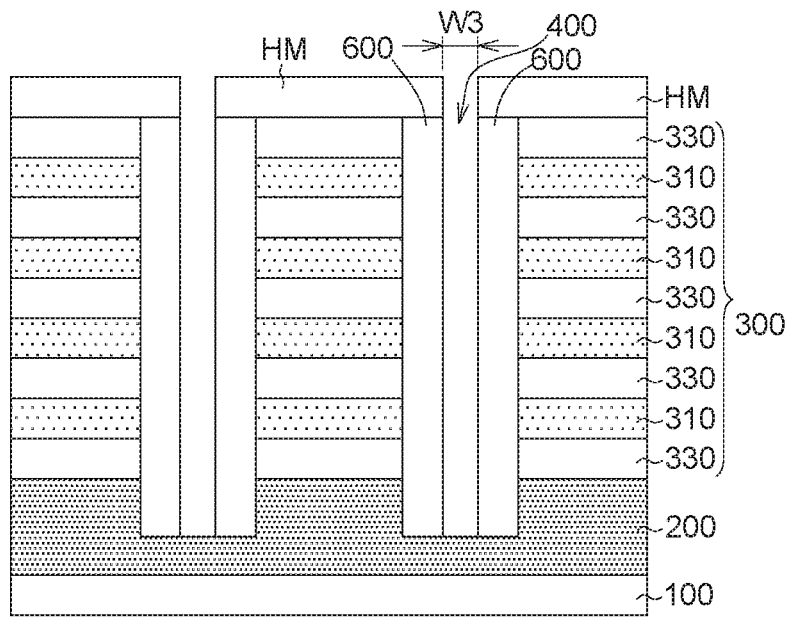
Figure 1D:
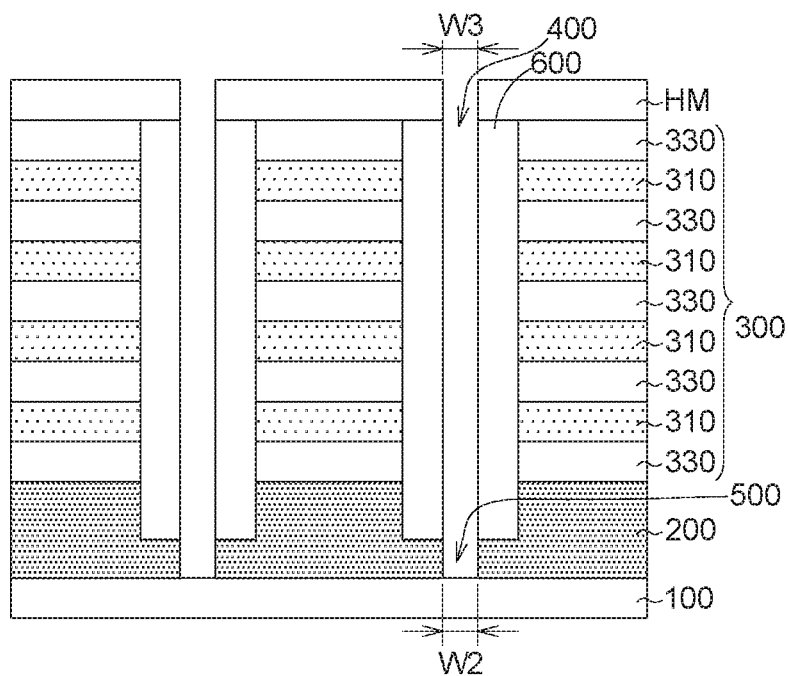
Figure 1E:
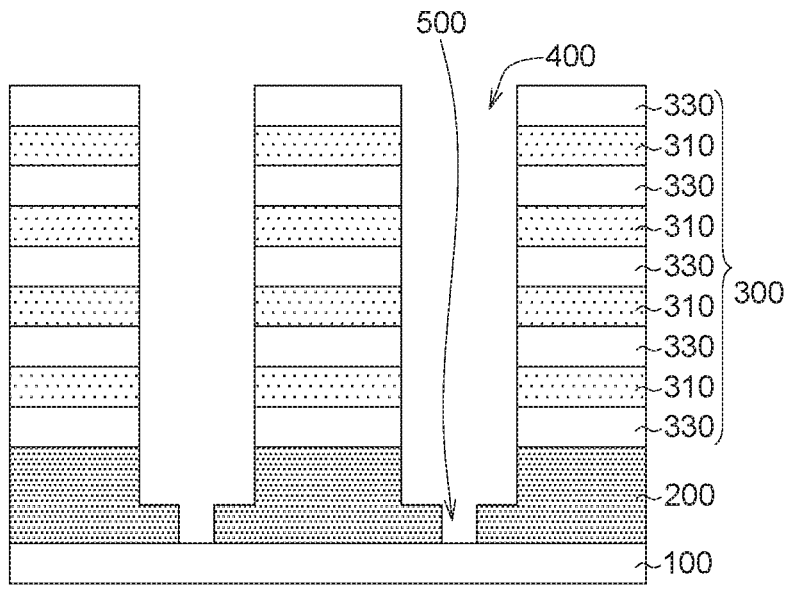

Please refer to FIGS. 1C-1E, a second opening having 500 is formed. The second opening 500 has a second cross-sectional width W2, the second opening 500 penetrates through the first conductive layer 200 below the first opening 400 for exposing the bottom oxide layer 100, and the second cross-sectional width W2 is smaller than the first cross-sectional width W1. In the embodiments, the manufacturing method of forming the second opening 500 includes such as the following steps.

As shown in FIG. 1C, a spacer 600 is formed on the sidewall of the first opening 400. In the embodiment, the spacer 600 may be formed by a deposition process followed by an etching process for forming the spacing W3 within the spacer 600 as shown in FIG. 1C. In the etching process, the etching may penetrate through the deposited material and stop on the first conductive layer 200 for forming the spacer 600. In the embodiment, the spacing W3 within the spacers 600 is about the same with the second cross-sectional width W2 of the second opening 500 which will be formed subsequently. For example, the spacing W3 is such as 10 nm-40 nm. In the embodiment, a material of the spacer 600 may be SiN, SiGe or Ge.

As shown in FIG. 1D, the first conductive layer 200 below the first opening 400 is etched according to the spacer 600 for forming the second opening 500 in the first conductive layer 200. As shown in FIG. 1D, for example, the etching process may be performed on the first conductive layer 200 and stops on the bottom oxide layer 100 for forming the second opening 500. This etching process is higher selectivity to oxide (the bottom oxide layer 100) and the spacer 600, so the etch amount of the bottom oxide layer 100 is much less than 10-100 Å.

In the embodiments, the second cross-sectional width W2 is such as 10 nm-40 nm.

Next, as shown in FIG. 1E, the spacer 600 is removed for exposing the first opening 400. In addition, the hard mask layer HM is removed. In the embodiments, a hot $H_3PO_4$ etching solution may be applied to etch away the hard mask layer HM and the spacer 600.

Figure 1F:
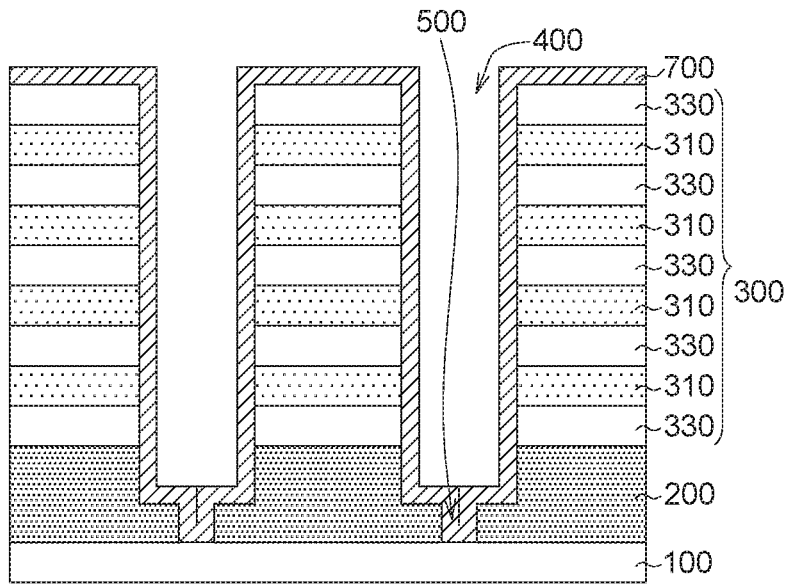

Please refer to FIG. 1F, a memory layer 700 is formed on the sidewall of the first opening 400 and filled in the second opening 500. In the embodiment, the memory layer 700 may have multi-layers of a silicon oxide-silicon nitride-silicon oxide (ONO) structure, a silicon oxide-silicon nitride-silicon oxide-silicon nitride-silicon oxide (ONONO) structure, or a silicon oxide-silicon nitride-silicon oxide-silicon nitride-silicon oxide-silicon nitride-silicon oxide (ONONONO) structure, but not limited thereto.

In the embodiment, a thickness of the memory layer 700 is such as larger than or equal to one-half of the second cross-sectional width W2. In other words, twice the thickness of the memory layer 700 is about equal to or larger than the second cross-sectional width W2, such that the second opening 500 can be filled in the process of depositing the memory layer 700, and the two portions of the first conductive layer 200 located on two sides of the second opening 500 can be separated from each other, resulting in that the first conductive layer 200 forms a plurality of inversion gates. In some embodiments, the thickness of the memory layer 700 is such as about 20 nm.

Figure 1G:
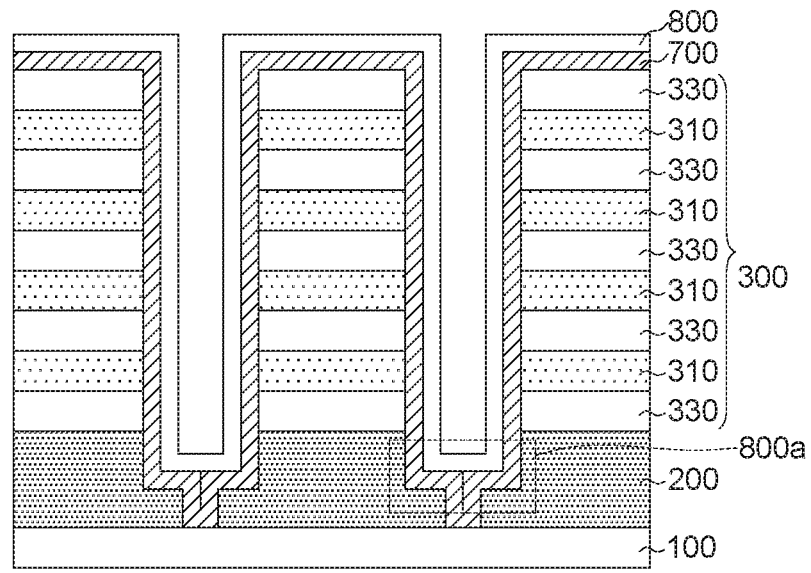

Next, please refer to FIG. 1G, a channel layer 800 is formed on the memory layer 700 and above the second opening 500. The channel layer 800 is such as a polysilicon layer, a Ge layer, a SiGe layer, or a GIZO layer.

As shown in FIG. 1G, according to the embodiments of the present disclosure, the memory layer 700 is formed on the sidewall of the first opening 400 and filled in the second opening 500 of the first conductive layer 200, thereby the channel layer 800 is located above the second opening 500 forming a U-shaped area 800a within the first conductive layer 200, such that the U-shaped area 800a of the channel layer 800 can be located close to the first conductive layer 200, and thus a relatively large range of the channel layer 800 can be controlled through the first conductive layer 200 by the gate, the range of the channel layer 800 which is uncontrolled by the gate can be effectively reduced, therefore the undesired influence caused by larger resistance and smaller current of the region of the channel layer 800 uncontrolled by the gate can be further minimized.

In addition, as shown in FIG. 1G, according to the embodiments of the present disclosure, the channel layer 800 is located on the memory layer 700; in other words, the channel layer 800 is not embedded within the memory layer 700, capped by other films or embedded in some pipe-lines, as such, it is easier to perform various treatments on the channel layer 800; for example, a heat treatment can be easily performed on the channel layer 800 to increase grain sizes, reduce grain boundaries, and increase currents.

According to the embodiments of the present disclosure, the as-formed semiconductor structure may be the main structure of a 3D vertical channel NAND flash memory device, wherein the first conductive layer 200 is such as inversion gates, and the second conductive layers 310 are such as word lines.

Figure 2:
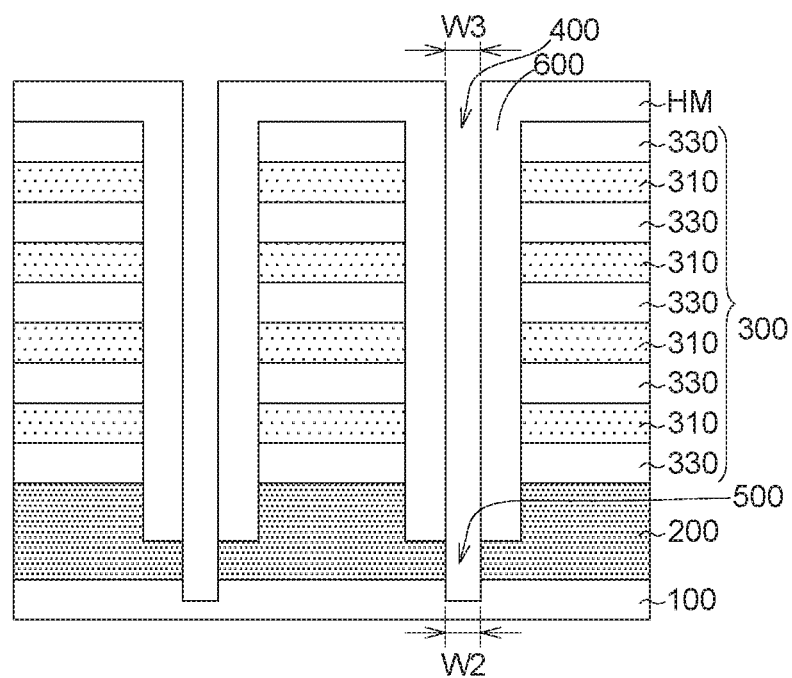
FIG. 2 illustrates a manufacturing method of a semiconductor structure according to another embodiment of the present disclosure.

FIG. 2 illustrates a manufacturing method of a semiconductor structure according to another embodiment of the present disclosure. The elements in the present embodiment sharing similar or the same labels with those in the previous embodiment are similar or the same elements, and the description of which is omitted.

Please refer to FIGS. 1A-1G and FIG. 2, as the manufacturing process proceeds to the step as shown in FIG. 1D, and when the first conductive layer 200 below the first opening 400 is etched according to the spacer 600, referring to FIG. 2, a portion of the bottom oxide layer 100 is further etched, such that the second opening 500 further penetrates through the portion of the bottom oxide layer 100.

Next, the manufacturing process continues as shown in FIGS. 1E-1G, the spacer 600 is removed, the memory layer 700 is formed on the sidewall of the first opening 400 and filled in the second opening 500, and the channel layer 800 is formed on the memory layer 700 and above the second opening 500. As such, a semiconductor structure according to another embodiment of the present disclosure may be formed as well and is also provided with effects of effectively reducing the range of the channel layer which is uncontrolled by the gate.

FIGS. 3A-3G illustrate a manufacturing method of a semiconductor structure according to a further embodiment of the present disclosure. The elements in the present embodiment sharing similar or the same labels with those in the previous embodiment are similar or the same elements, and the description of which is omitted.

Figure 3A:
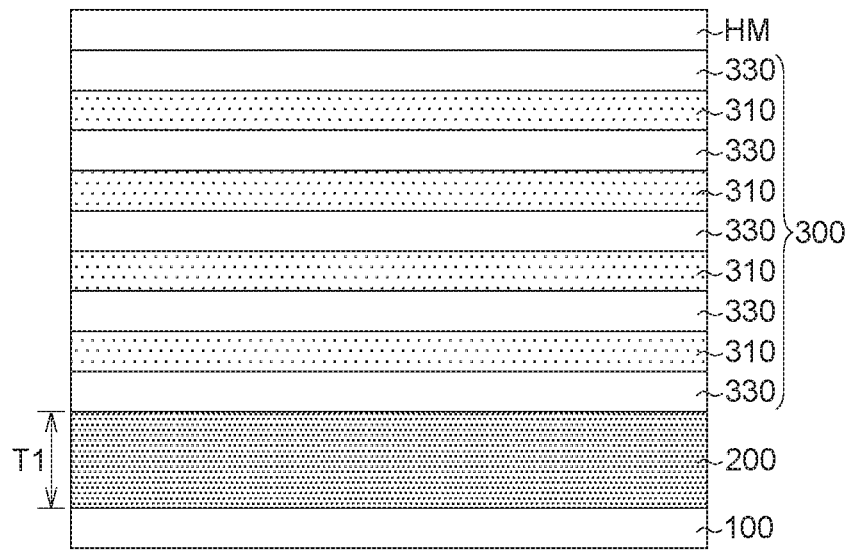
FIGS. 3A-3G illustrate a manufacturing method of a semiconductor structure according to a further embodiment of the present disclosure.
Figure 3B:
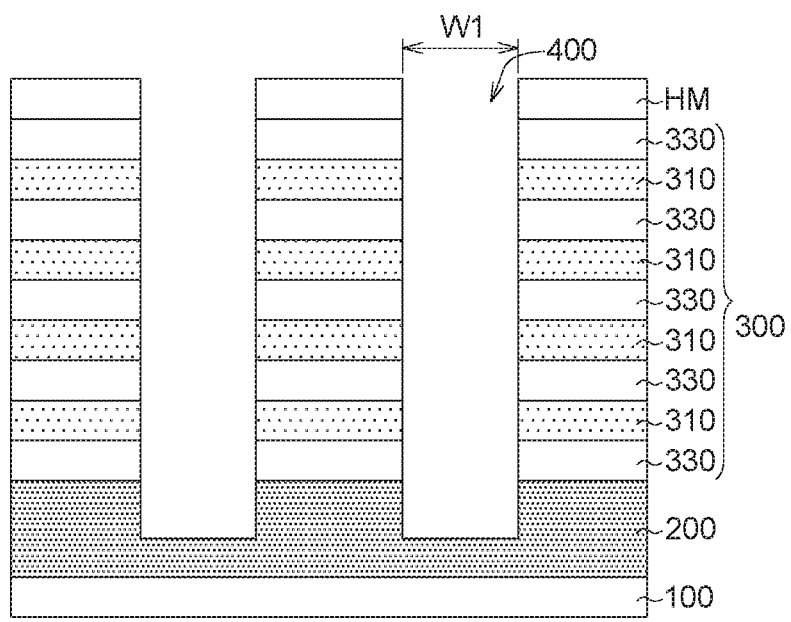

Please refer to FIGS. 3A-3D, the steps illustrated therein are similar to those described previously as shown in FIGS. 1A-1D. As shown in FIG. 3A, the bottom oxide layer 100 is formed, the first conductive layer 200 is formed on the bottom oxide layer 100, and the stack 300 is formed on the first conductive layer 200. The stack 300 includes alternately arranged second conductive layers 310 and insulating layers 330, and the second conductive layers 310 are electrically isolated from the first conductive layer 200. As shown in FIG. 3B, the first opening 400 is formed, and the first opening 400 has a first cross-sectional width W1 and penetrates through the stack 300 and a portion of the first conductive layer 200. As shown in FIG. 3B, the bottom of the first opening 400 is located in the first conductive layer 200.

Figure 3C:
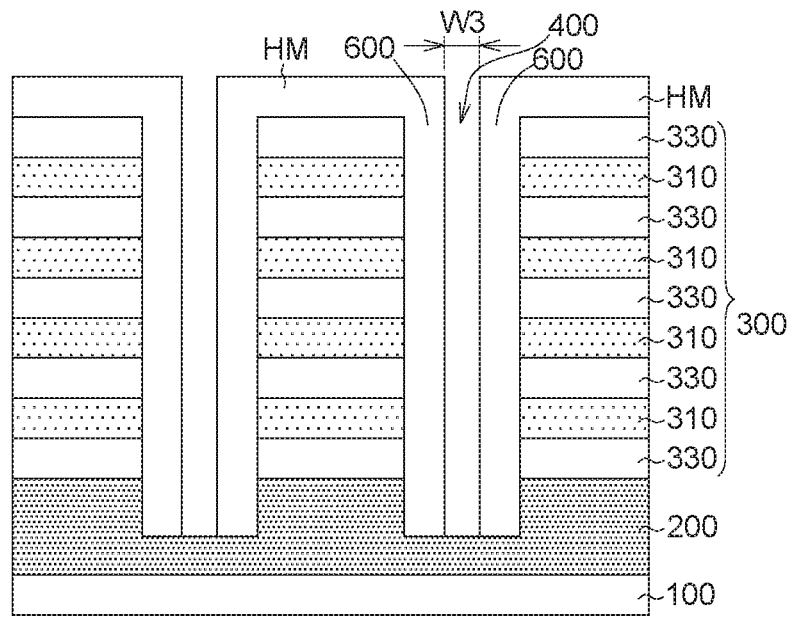
Figure 3D:
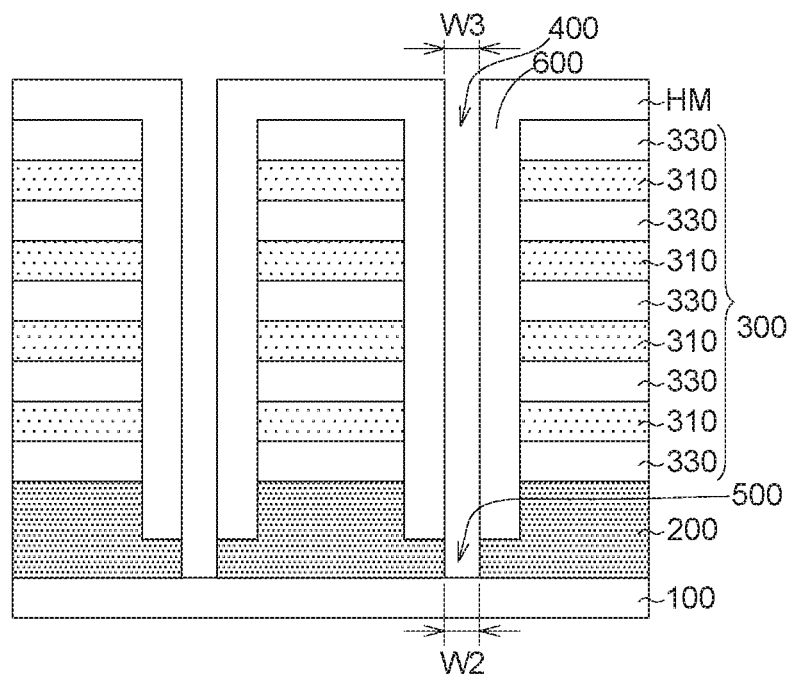

As shown in FIGS. 3C-3D, the second opening 500 having a second cross-sectional width W2 is formed, the second opening 500 penetrates through the first conductive layer 200 below the first opening 400 for exposing the bottom oxide layer 100, and the second cross-sectional width W2 is smaller than the first cross-sectional width W1. In the embodiments, as shown in FIG. 3C, a spacer 600 is formed on the sidewall of the first opening 400. Next, as shown in FIG. 3D, the first conductive layer 200 below the first opening 400 is etched according to the spacer 600 for forming the second opening 500 in the first conductive layer 200.

Figure 3E:
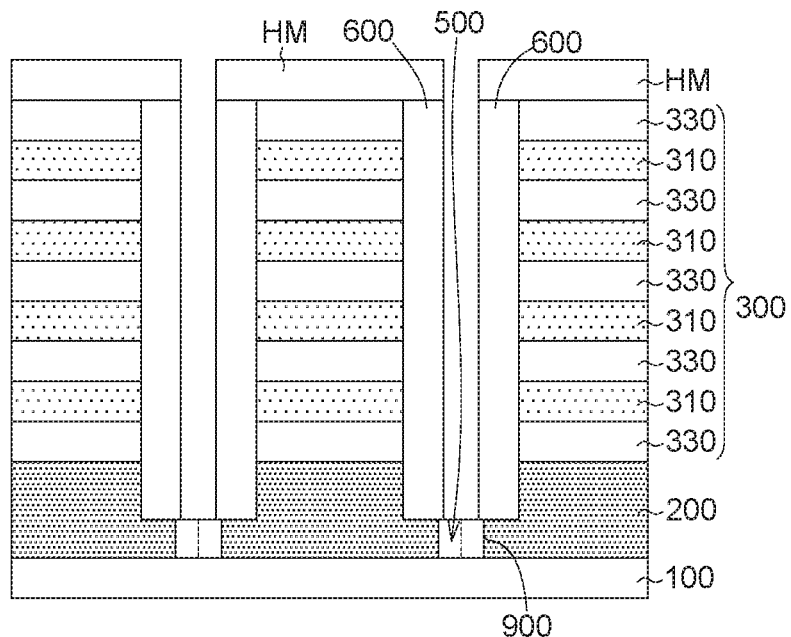

Please refer to FIG. 3E, an oxidation process is performed on the first conductive layer 200 exposed in the second opening 500 for forming an oxide 900 filled in the second opening 500. In the embodiment, the oxide 900 is actually formed by oxidizing the first conductive layer 200 in the second opening 500; that is, the oxide 900 is the oxidized product of a material of the first conductive layer 200, the oxide 900 grows from the peripheral of the second opening 500 toward inside of the second opening 500 until the second opening 500 is filled and sealed by the as-formed oxide 900. In the embodiment, the width of the oxide 900 is such as 40 nm-60 nm, such that the first conductive layer 200 located on two sides of the second opening 500 can be effectively separated from each other, resulting in that the first conductive layer 200 forms a plurality of inversion gates, such that the fringe-field effect of the inversion gates can be effectively controlled.

In the embodiments, the oxidation process is such as a dry oxidation process, a wet oxidation process, an in-situ steam generation (ISSG) or a plasma oxidation process. In the embodiment, the material of the first conductive layer 200 is such as n-type doped polysilicon. In a dry oxidation process, the thickness of the oxide formed from n-type doped polysilicon is about twice the thickness of the oxide formed from un-doped polysilicon. In a wet oxidation process, the thickness of the oxide formed from n-type doped polysilicon can be about three to four times the thickness of the oxide formed from un-doped polysilicon.

In addition, a ratio of an oxidation rate of a dry oxidation process or a wet oxidation process performed on polysilicon to an oxidation rate of the dry oxidation process or the wet oxidation process performed on silicon nitride is about 50:1, a ratio of an oxidation rate of an ISSG oxidation process performed on polysilicon to an oxidation rate of the ISSG oxidation process performed on silicon nitride is about 100:70, and a ratio of an oxidation rate of a plasma oxidation process performed on polysilicon to the plasma oxidation process performed on silicon nitride is about 100:40. In other words, when a dry oxidation process or a wet oxidation process is used to oxidize the first conductive layer 200 in the second opening 500, such oxidation process does not easily oxidize the spacer 600 and the hard mask layer HM made of silicon nitride. As such, the spacer 600 and the hard mask layer HM can protect the second conductive layers 310 (word lines) from undesired influence of the oxidation process more effectively, and the fact that the spacer 600 and the hard mask layer HM made of silicon nitride are not easily oxidized is more advantageous to the subsequent removal of the spacer 600 and the hard mask layer HM.

Figure 3F:
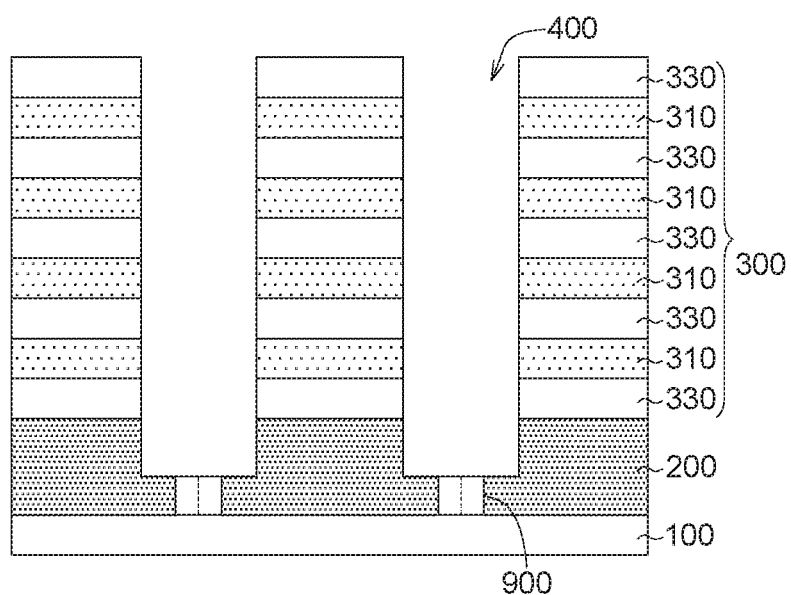

Please refer to FIG. 3F, the spacer 600 is removed for exposing the first opening 400. In addition, the hard mask layer HM is removed. In the embodiments, a hot $H_3PO_4$ etching solution may be applied to etch away the hard mask layer HM and the spacer 600.

Figure 3G:
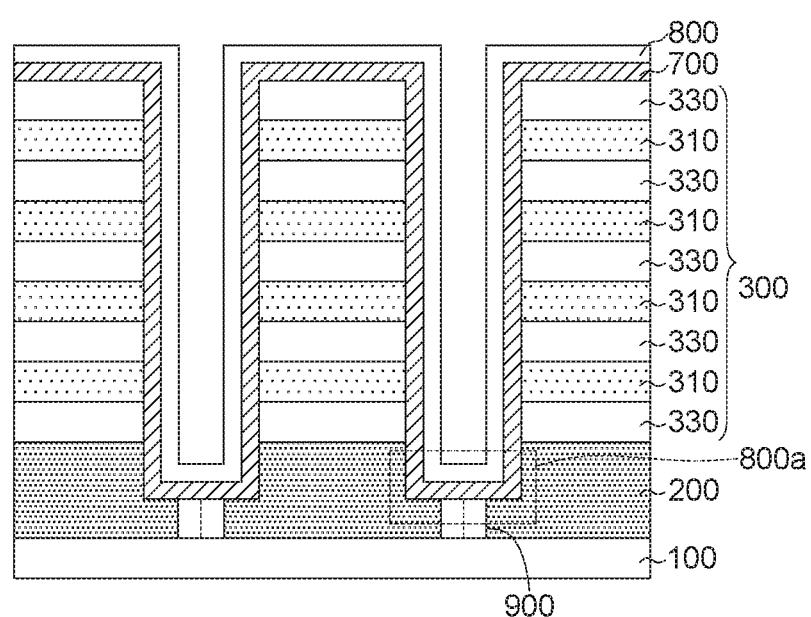

Next, please refer to FIG. 3G, the memory layer 700 is formed on the sidewall of the first opening 400 and on the oxide 900, and the channel layer 800 is formed on the memory layer 700.

As shown in FIG. 3G, according to the embodiments of the present disclosure, the oxide 900 is filled in the second opening 500, and the memory layer 700 is formed on the sidewall of the first opening 400 and on the oxide 900, thereby the channel layer 800 is located above the second opening 500 forming a U-shaped area 800a within the first conductive layer 200, such that the U-shaped area 800a of the channel layer 800 can be located close to the first conductive layer 200, and thus a relatively large range of the channel layer 800 can be controlled through the first conductive layer 200 by the gate, the range of the channel layer 800 which is uncontrolled by the gate can be effectively reduced, therefore the undesired influence caused by larger resistance and smaller current of the region of the channel layer 800 uncontrolled by the gate can be further minimized.

In addition, similar to the embodiment previously illustrated in the FIG. 2, in the method described in FIGS. 3A-3G, referring to FIG. 2, a portion of the bottom oxide layer 100 may be further etched, such that the second opening 500 further penetrates through the portion of the bottom oxide layer 100, and the oxide 900 is filled in the second opening 500.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a semiconductor structure, comprising:
   forming a bottom oxide layer;
   forming a first conductive layer on the bottom oxide layer;
   forming a stack on the first conductive layer, the stack comprising alternately arranged second conductive layers and insulating layers;
   forming a first opening having a first cross-sectional width and penetrating through the stack and a portion of the first conductive layer;
   forming a second opening having a second cross-sectional width and penetrating through the first conductive layer below the first opening for exposing the bottom oxide layer, wherein the second cross-sectional width is smaller than the first cross-sectional width; and
   forming a memory layer on a sidewall of the first opening and filled in the second opening, wherein a thickness of the memory layer is larger than or equal to one-half of the second cross-sectional width.

2. The manufacturing method of the semiconductor structure according to claim 1, wherein forming the second opening comprises:
   forming a spacer on the sidewall of the first opening; and
   etching the first conductive layer below the first opening according to the spacer for forming the second opening in the first conductive layer.

3. The manufacturing method of the semiconductor structure according to claim 2, further comprising:
   removing the spacer for exposing the first opening.

4. The manufacturing method of the semiconductor structure according to claim 1, wherein the second opening further penetrates through a portion of the bottom oxide layer.

5. The manufacturing method of the semiconductor structure according to claim 1, further comprising:
   forming a channel layer on the memory layer and above the second opening.

6. The manufacturing method of the semiconductor structure according to claim 1, wherein the first cross-sectional width is 60 nm-140 nm.

7. The manufacturing method of the semiconductor structure according to claim 1, wherein the second cross-sectional width is 10 nm-40 nm.

8. The manufacturing method of the semiconductor structure according to claim 1, wherein a thickness of the first conductive layer is 1500 Å-2000 Å.

9. The manufacturing method of the semiconductor structure according to claim 1, wherein the first conductive layer comprises n-type doped polysilicon, and the second conductive layers comprise p-type doped polysilicon.

* * * * *